United States Patent [19]
Frisina et al.

[11] Patent Number: 5,888,889
[45] Date of Patent: Mar. 30, 1999

[54] INTEGRATED STRUCTURE PAD ASSEMBLY FOR LEAD BONDING

[75] Inventors: Ferruccio Frisina, S. Agata Li Battiati; Marcantonio Mangiagli, Acireale, both of Italy

[73] Assignee: Consorzio per la Ricerca sulla Microelettronica nel Mezzogiorno, Catania, Italy

[21] Appl. No.: 483,315

[22] Filed: Jun. 7, 1995

Related U.S. Application Data

[62] Division of Ser. No. 361,801, Dec. 21, 1994, Pat. No. 5,592,026.

[30] Foreign Application Priority Data

Dec. 24, 1993  [EP]  European Pat. Off. ............. 93830524

[51] Int. Cl.⁶ .......................... H01L 21/28; H01L 21/22; H01L 21/60
[52] U.S. Cl. .................. 438/545; 438/546; 438/597; 438/611; 438/612; 438/621
[58] Field of Search ................... 437/182, 209; 438/545, 546, 597, 611, 612, 621

[56] References Cited

U.S. PATENT DOCUMENTS

| | | | |
|---|---|---|---|
| 3,434,019 | 3/1969 | Carley | 317/235 |
| 3,667,008 | 5/1972 | Katnack | 317/235 |
| 3,831,067 | 8/1974 | Wislocky et al. | 317/234 |
| 4,008,486 | 2/1977 | Byczkowski | 357/74 |
| 4,015,278 | 3/1977 | Fukuta | 357/22 |
| 4,017,886 | 4/1977 | Tomono et al. | 357/54 |
| 4,055,884 | 11/1977 | Jambotkar | 29/571 |
| 4,070,690 | 1/1978 | Wickstrom | 357/68 |
| 4,145,700 | 3/1979 | Jambotkar | 357/23 |
| 4,236,171 | 11/1980 | Shen | 357/68 |
| 4,305,087 | 12/1981 | Wislocky | 357/79 |
| 4,329,642 | 5/1982 | Luthi et al. | 324/158 |
| 4,376,286 | 3/1983 | Lidow et al. | 357/23 |
| 4,399,449 | 8/1983 | Herman et al. | 357/53 |
| 4,412,242 | 10/1983 | Herman et al. | 357/52 |
| 4,414,560 | 11/1983 | Lidow | 357/39 |
| 4,556,896 | 12/1985 | Meddles | 357/70 |
| 4,574,208 | 3/1986 | Lade et al. | 257/365 |
| 4,593,302 | 6/1986 | Lidow et al. | 357/23.4 |
| 4,606,998 | 8/1986 | Clodgo et al. | 430/312 |
| 4,638,553 | 1/1987 | Nilarp | 29/580 |
| 4,639,762 | 1/1987 | Neilson et al. | 257/341 |
| 4,641,418 | 2/1987 | Meddles | 29/588 |
| 4,642,419 | 2/1987 | Meddles | 174/52 |
| 4,651,181 | 3/1987 | Ge Rard | 257/341 |
| 4,663,820 | 5/1987 | Ionescn | 29/590 |
| 4,680,853 | 7/1987 | Lidow et al. | 29/571 |

(List continued on next page.)

FOREIGN PATENT DOCUMENTS

| | | | |
|---|---|---|---|
| 1136291 | 11/1982 | Canada | H01L 29/94 |
| A-0 421 344 | 4/1991 | European Pat. Off. | H01L 23/48 |
| A-0 433 650 | 6/1991 | European Pat. Off. | H01L 23/48 |
| A-0450320 | 10/1991 | European Pat. Off. | H01L 21/60 |
| 1224335 | 3/1971 | United Kingdom | H01L 11/14 |
| 2 087 648 | 5/1982 | United Kingdom | H01L 23/00 |

OTHER PUBLICATIONS

European Search Report from European Patent Application No. 93830523.2, filed Dec. 24, 1993.

Patent Abstracts of Japan, vol. 17, No. 570 (E–1448) Oct. 1993 & JP–A–05167070 NEC Kansai Ltd.

Primary Examiner—David Graybill
Attorney, Agent, or Firm—Wolf, Greenfield & Sacks, P.C.

[57] ABSTRACT

A process for manufacturing an integrated structure pad assembly for wire bonding to a power semiconductor device chip including a chip portion having a top surface covered by a metallization layer which has a first sub-portion wherein functionally active elements of the power device are present. The chip portion has at least one second sub-portion wherein no functionally active elements of the power device are present. The top surface of the at least one second sub-portion is elevated with respect to the first sub-portion to form at least one protrusion which forms a support surface for a wire.

23 Claims, 3 Drawing Sheets

U.S. PATENT DOCUMENTS

| | | | |
|---|---|---|---|
| 4,723,197 | 2/1988 | Takiar et al. | 361/403 |
| 4,789,882 | 12/1988 | Lidow | 357/23.4 |
| 4,794,431 | 12/1988 | Park | 357/19 |
| 4,845,545 | 7/1989 | Abramowitz et al. | 357/74 |
| 4,853,762 | 8/1989 | Ewer et al. | 357/79 |
| 4,878,099 | 10/1989 | Nilarp | 357/71 |
| 4,881,106 | 11/1989 | Barron | 357/23.8 |
| 4,890,142 | 12/1989 | Tonnel et al. | 257/343 |
| 4,965,173 | 10/1990 | Gould | 430/317 |
| 5,016,066 | 5/1991 | Takahashi | 257/341 |
| 5,047,833 | 9/1991 | Gould | 357/71 |
| 5,130,767 | 7/1992 | Lidow et al. | 357/23.4 |
| 5,153,507 | 10/1992 | Fong et al. | 257/786 |
| 5,250,821 | 10/1993 | Ferla et al. | 257/723 |
| 5,365,112 | 11/1994 | Ohshima | 257/786 |

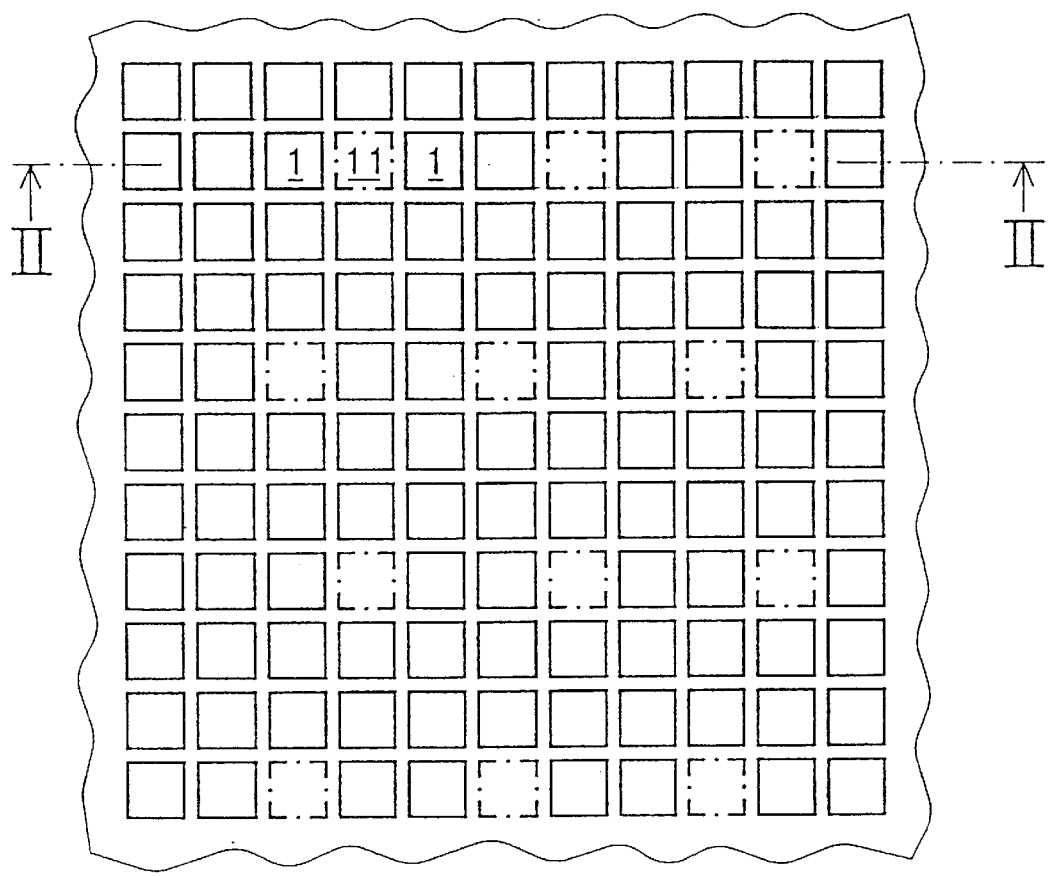
Fig.1
Fig.2
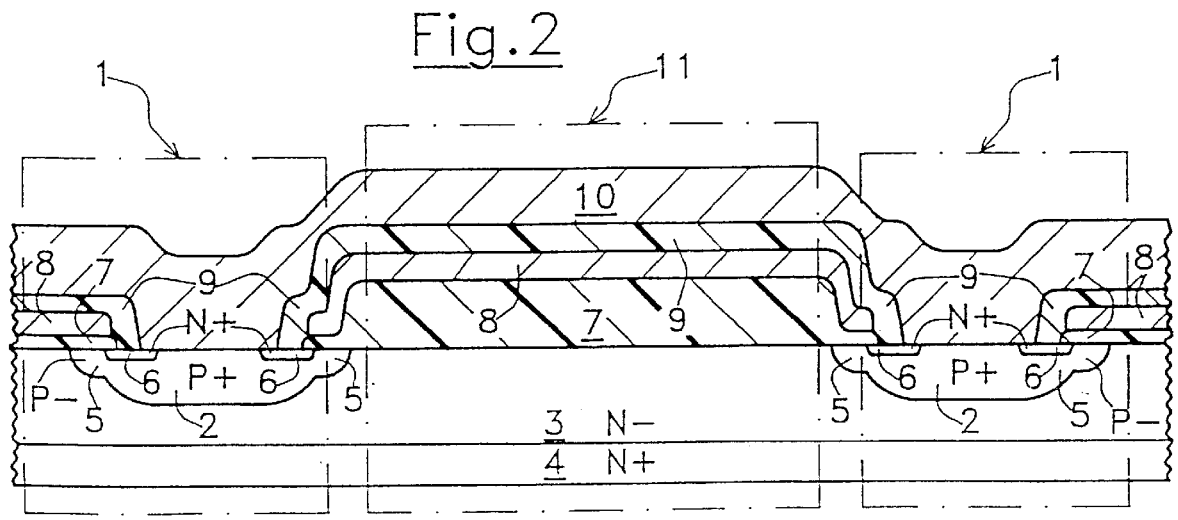

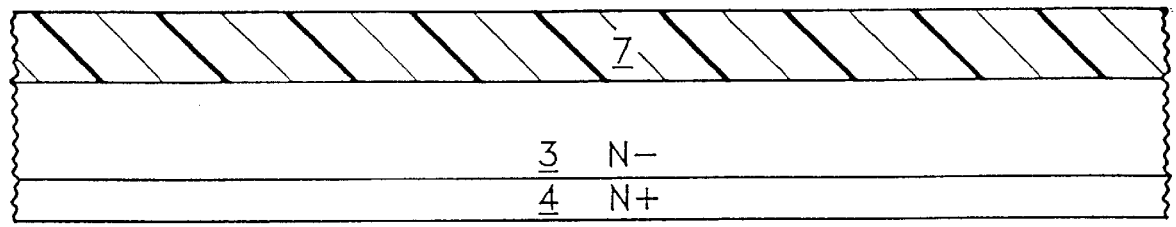
Fig.5
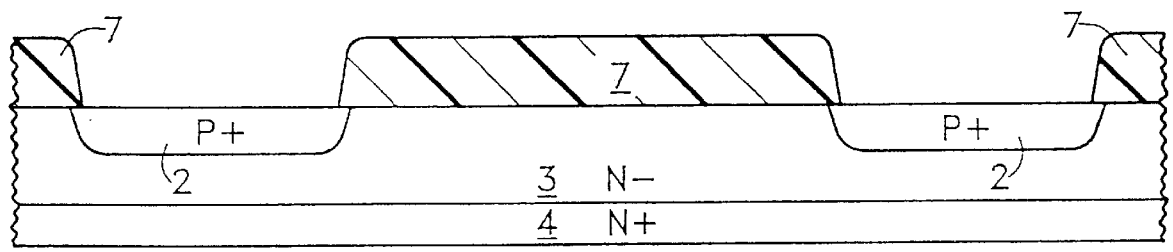
Fig.6
Fig.7
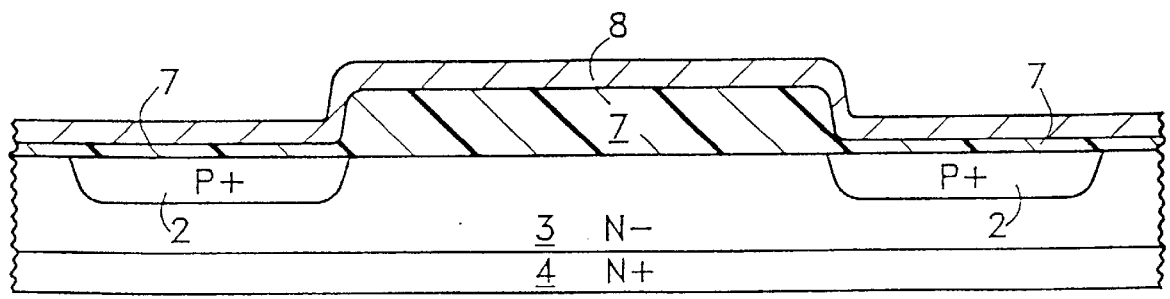

INTEGRATED STRUCTURE PAD ASSEMBLY FOR LEAD BONDING

This application is a division of application Ser. No. 08/361,801, filed Dec. 21, 1994, entitled INTEGRATED STRUCTURE PAD ASSEMBLY FOR LEAD BONDING, U.S. Pat. No. 5,592,026.

BACKGROUND OF THE INVENTION

1. Field of the Invention

The present invention discloses an integrated structure pad assembly for wire bonding on active area in power semiconductor devices, particularly those with cellular structures such as power MOSFETs and Insulated Gate Bipolar Transistors, and to a manufacturing process therefor.

2. Discussion of the Related Art

In power semiconductor devices such as those fabricated in MOS technology the chip area reserved to the bonding pads can be a significant fraction of the overall chip area. In the case for example of a low-voltage power MOSFET with a specified voltage rating of 100 V, the MOSFET current can be in the range of several tens of Amperes. To sustain such a current, the source wire must have a large diameter, typically 0.4–0.5 mm, and the area dedicated to bonding the wire to the chip must be of the order of 1.3×1.3 mm². The situation is even worse when more than one source wire is necessary.

To overcome this problem, a technique in which the bonding areas are directly over the active area of the device is utilized without the necessity of providing dedicated pad areas. This technique is known as "bonding on active area", and allows a reduction in the chip size, since no areas are wasted for the realization of the bonding pads.

This technique however poses some problems, particularly as far as the soldering process between the wire and the chip metallization layer is concerned. Generally, aluminum wires having large diameters are soldered to the chip metallization layer by a technique known as "Ultrasonic Wire Bonding" (USWB). This technique consists of laying the wire to be soldered on the aluminum layer on the chip, applying a given vertical force to the wire, and simultaneously submitting the wire to an "ultrasonic discharge". The ultrasonic discharge, together with the pressure exerted on the wire, put the two surfaces into close contact, breaking down their superficial oxides so that soldering is obtained.

When Ultrasonic Wire Bonding on active area is carried out, for example on a power MOSFET chip, the significant mechanical stress to which the device is submitted during the bonding phase is transferred to the dielectric layers underlying the metallization layer, i.e. to the gate oxide layer and to the polysilicon gate layer, causing cracks in the oxide layer or microdefects which reduce the device reliability. The gate oxide layer, being generally the thinnest dielectric layer, is the most susceptible to such damage. The larger the diameter of the wires used, the more probable the phenomenon is. When wires of diameter larger than 0.4 mm are used, systematic damage can take place. Furthermore, since the technology trend in low-voltage power MOS devices is toward a reduction in the oxide layer thickness to reduce the output resistance and to increase the current densities, bonding on active area becomes more and more impractical.

SUMMARY OF THE INVENTION

In view of the state of the art as described, the object of the present invention is to create an integrated structure pad assembly for wire bonding which allows bonding on active area without the above mentioned drawbacks.

According to the present invention, this object is attained by means of an integrated structure pad assembly for wire bonding in a power semiconductor device chip. The semiconductor device chip includes a chip portion having a top surface covered by a metallization layer which has a first sub-portion wherein functionally active elements of the power device are present. The chip portion contains at least one second sub-portion wherein no functionally active elements of the power device are present. The top surface of the at least one second sub-portion is elevated with respect to the top surface of the first sub-portion to form at least one protrusion which forms a support surface for a wire.

In a pad assembly having a structure according to the present invention, the mechanical stresses transmitted by the wire to the power device chip during the bonding process are sustained by the second sub-portion which does not contain any functionally active element of the power device.

According to a preferred embodiment of the present invention, the power semiconductor device comprises a plurality of identical functionally active elementary cells disposed in a horizontal bidimensional array. Said first sub-portion comprises at least- one of said functionally active elementary cells, and said at least one second sub-portion is represented by a dummy cell having horizontal dimensions substantially identical to the horizontal dimensions of the functionally active elementary cells, said dummy cell having a vertical dimension larger than the vertical dimension of the functionally active elementary cells so that the top surface of the metallization layer is elevated over the dummy cell with respect to the functionally active elementary cells.

In this embodiment of the invention, since the bonding wires do not come into hard physical contact with the elementary functional cells but only with the dummy cells and since these latter are more resistant to mechanical stress than the elementary functional cells, it possible to realize a bonding pad assembly directly on the active area of the power semiconductor device without the risk of damaging the power device.

The features of the present invention will be made more evident by the following detailed description of three practical realization of its preferred embodiment, illustrated as non-limiting examples in the annexed drawings.

BRIEF DESCRIPTION OF THE DRAWINGS

FIG. 1 is a schematic top plan view of an integrated structure pad assembly according to a first practical realization of one embodiment of the invention;

FIG. 2 is a cross-sectional view taken along the line II—II of FIG. 1;

FIGS. 5 to 7 are cross-sectional views similar to that shown in FIG. 2, showing intermediate steps during the manufacturing process.

DETAILED DESCRIPTION

Figure 3:
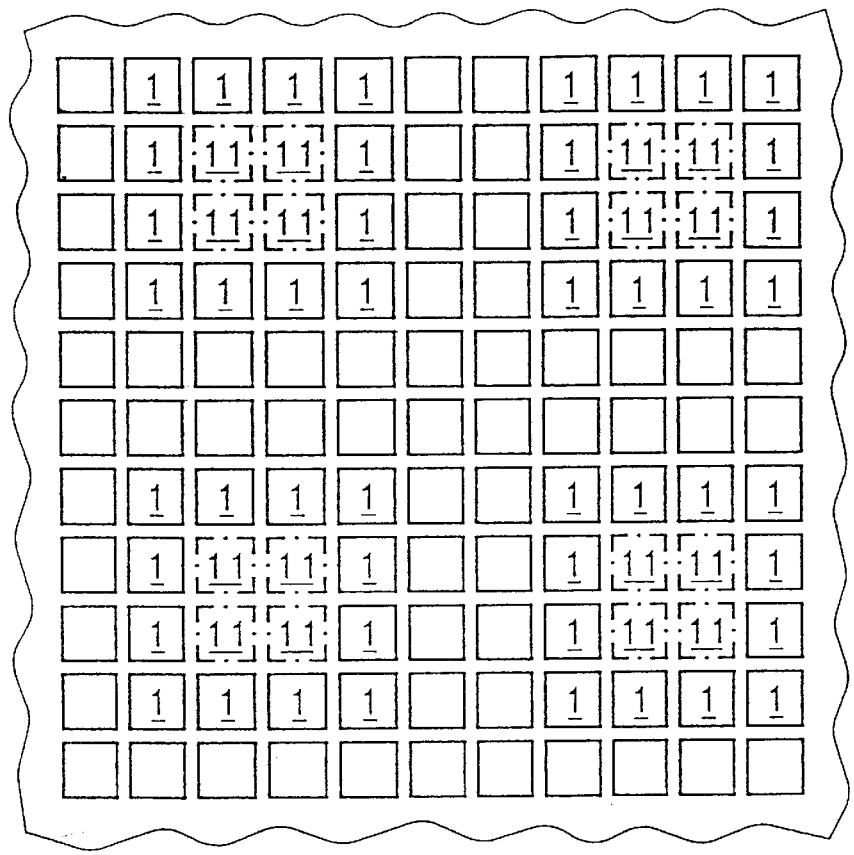
FIG. 3 is a schematic top plan view of an integrated structure pad assembly according to another embodiment of the invention.

A power semiconductor device, for example a power MOSFET, is composed of a plurality of elementary cells, also called "source cells", disposed to form a bidimensional array. In FIG. 2 two source cells 1 are shown each formed by a respective first sub-portion of semiconductor device chip. They comprise a P+ deep body region 2 within an N– epitaxial layer 3 which is in turn grown over an N+ substrate 4. The P+ deep body region 2 is laterally surrounded by and merged with a P– annular region 5. Inside the P type semiconductor region composed of the P– annular region 5 and by the P+ deep body region 2, an N+ annular region 6 is obtained constituting a source region of the elementary source cell 1. At the semiconductor surface, an oxide layer 7 extends over the P– annular region 5 and partially over the N+ annular region 6. A polysilicon layer 8 is superimposed over and autoaligned with the underlying oxide layer 7. An insulating layer 9 covers the polysilicon layer 8 and is selectively etched to form contact areas to allow an overlying metal layer 10 to come into contact with both the N+ annular region 6 and the P+ deep body region 2. The metal layer 10 contacts in the same way all the elementary source cells 1 and constitutes a source electrode for the power MOSFET.

An integrated structure pad assembly according to a first practical realization of a preferred embodiment of the invention, shown in FIG. 1, is substantially constituted of a bidimensional array of elementary source cells 1 intercalated with dummy cells 11 having horizontal dimensions identical to those of the source cells 1 but of different height. This clearly appears in FIG. 2, wherein the cross-section of one of such dummy-cell 11 is shown as formed by a second sub-portion of the semiconductor chip. Different from an elementary source cell 1, no P+ deep body region 2, P– annular region 5 or N+ annular region 6 are provided in the dummy cell 11. Furthermore, the thickness of the oxide layer 7 in the dummy cells is greater than the thickness of said oxide layer 7 in the source cells 1. This causes the surface of the metal layer 10 to be elevated over the dummy cells 11 with respect to the source cells 1. The dummy cells 11 are more resistant to mechanical stresses than the source cells because of the greater thickness of the oxide layer 7. Due to the fact that the metal layer of the dummy cells 10 protrudes outwardly with respect to the surface of the source cells, when a wire is laid on the pad for being soldered to it, said wire does not come into hard physical contact with the elementary source cells 1, but only with the dummy cells 11.

Various topological distribution of dummy cells 11 and elementary source cells 1 are possible, depending on the wire diameter. In FIG. 1, a distribution is shown in which about 90% of the pad area is occupied by elementary source cells 1 and 10% by dummy cells 11. This means that 90% of the pad area is active area, and only 10% of the area is wasted.

In FIG. 3 another embodiment of the invention is shown. This arrangement is substantially different than the previous one in that a different topological distribution of elementary source cells 1 and dummy cells 11 is used. However, as in the previous practical realization, 90% of the total pad area is active area while the 10% is wasted area.

Figure 4:
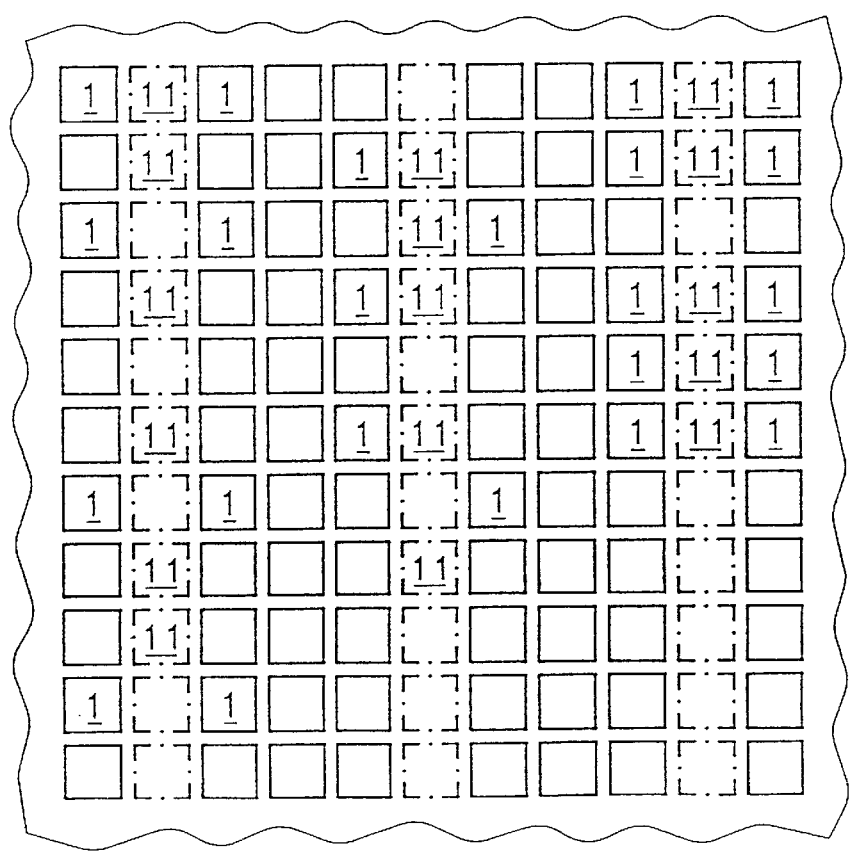
FIG. 4 is a schematic top plan view of an integrated structure pad assembly according to another embodiment of the invention.

In FIG. 4 another embodiment is shown in which the dummy cells 11 are disposed to form lines.

As already noted, different topological dispositions and densities of the dummy cells 11 in the array of elementary cells 1 can be used, depending on the wire diameter and on the total pad area.

For the manufacturing of an integrated structure pad assembly according to the preferred embodiment of the invention, a lightly doped N– epitaxial layer 3 is initially grown over a heavily doped N+ substrate 4. The latter is generally a silicon wafer with the "100" crystallographic cut orientation, and has a resistivity of about 10 mohm/cm. The epitaxial layer is instead highly resistive, having a resistivity value ranging from 1 to 100 ohm/cm. The thickness of the epitaxial layer 3 ranges from 1 to 100 $\mu$m.

The silicon wafer is then oxidixed to obtain an oxide layer having thickness of about 1 or 2 $\mu$m (FIG. 5). Masking and selective etching allow for windows in the oxide layer in correspondence of the areas of formation of the elementary source cells 1 of the power device. The oxide layer is not removed from the areas wherein dummy cells 11 are to be obtained or in the Periphery of the chip.

Boron ions are then implanted into the epitaxial layer 3 through said windows in the oxide layer to form the P+ deep body regions 2 of the elementary cells 1 (FIG. 6).

The oxide layer 7 is then removed from the surface of the active area of the power device but not from the areas wherein the dummy cells 11 are to be formed.

The active area of the device is then covered by a thinner oxide layer to form the gate oxide layer, and the whole semiconductor surface is covered by a polysilicon layer 8 (FIG. 7).

Windows are then opened in the polysilicon layer 8 and in the thinner oxide layer to selectively implant dopant ions to form the P– annular regions 5 and the N+ source regions 6 of the elementary cells 1.

An insulation layer 9 (FIG. 2) is then deposited on the semiconductor surface and contact windows are opened in it to allow a metal layer 10 to come into contact with the source regions 6 and with the P+ deep body region 2 of all the elementary cells 1. A metallization layer is also deposited on the bottom surface of the device to form a drain electrode of the power MOSFET.

Having thus described several embodiments of the invention, various alterations, modifications and improvements will readily occur to those skilled in the art. Such alterations, modifications and improvements are intended to be part of this disclosure and are intended to be within the spirit and scope of the invention. Accordingly, the foregoing description is by way of example only and not intended as limiting. The invention is limited only as defined in the following claims and equivalents thereto.

What is claimed is:

1. A method of lead bonding to an integrated structure pad assembly comprising the steps of:

forming first and second regions of a first dopant type in the semiconductor material, wherein the step of forming the first and second regions includes forming the second region in a square array and surrounding the second region with a first region;

implanting dopant ions of a second dopant type within the first region of the semiconductor material:

completely covering the first region of the semiconductor with a metallization layer:

completely covering the second region of semiconductor material with a metallization layer wherein the metallization layer completely covering the second region of semiconductor material is both continuous with the metallization layer completely covering the first region of semiconductor material and elevated with respect to the metallization layer completely covering the first region of semiconductor material: and bonding a lead to the portion of the metallization layer above the second region of semiconductor material.

2. A method of lead bonding to an integrated structure pad assembly, comprising the steps of:

forming first and second regions of a first dopant type in the semiconductor material wherein the step of forming the first and first regions includes forming the first region in a two-by-two square array and surrounding the first region with the second region;

implanting dopant ions of a second dopant type within the first region of the semiconductor material:

completely covering the first region of the semiconductor with a metallization layer:

completely covering the second region of semiconductor material with a metallization layer wherein the metallization layer completely covering the second region of semiconductor material is both continuous with the metallization layer completely covering the first region of semiconductor material and elevated with respect to the metallization layer completely covering the first region of semiconductor material: and bonding a lead to the portion of the metallization layer above the second region of semiconductor material.

3. A method of making an integrated structure the integrated structure being formed of a semiconductor material having first and second portions of a first dopant type the method comprising the steps of:

(a) forming an area of a second dopant type within the first portion of the semiconductor material:

(b) disposing a first metallization layer above at least a region of a surface of the first portion of the semiconductor material:

(c) disposing a second metallization layer above at least a region of a surface of the second portion of the semiconductor material so that the second metallization layer is in electrical communication with the first metallization layer:

(d) disposing a first oxide layer having a first thickness between the first portion of the semiconductor material and the first metallization layer; and (e) disposing a second oxide layer having a second thickness between the second portion of the semiconductor material and the second metallization layer such that the second thickness is different than the first thickness.

4. The method according to claim 3, further comprising a step of bonding a lead to a surface of the second metallization layer.

5. The method according to claim 3, wherein step (b) includes disposing the first metallization layer over an entire surface of the first portion of the semiconductor material.

6. The method according to claims 5, wherein step (c) includes disposing the second metallization layer over an entire surface of the second portion of the semiconductor material.

7. The method according to claim 6, wherein step (c) includes disposing a second metallization layer that is continuous with the first metallization layer.

8. The method according to claim 3, wherein step (c) includes disposing a second metallization layer that is continuous with the first metallization layer.

9. The method according to claim 3, wherein step (e) includes disposing a second oxide layer such that the second thickness is greater than the first thickness.

10. A method of making an integrated structure, the integrated structure being formed of a semiconductor material having first and second portions of a first dopant type, the method comprising the steps of:

(a) forming an area of a second dopant type within the first portion of the semiconductor material;

(b) disposing a first oxide layer of a first thickness on the first portion of the semiconductor material; and (c) disposing a second oxide layer of a second thickness, different than the first thickness, over the second portion of the semiconductor material.

11. The method according to claim 10, wherein step (c) includes disposing a second oxide layer with a second thickness that is greater than the first thickness.

12. The method according to claim 11, further comprising the steps of:

(d) disposing a first metallization layer above at least a region of a surface of the first oxide layer; and (e) disposing a second metallization layer above at least a region of a surface of the second oxide layer such that the second metallization layer is in electrical communication with the first metallization layer.

13. The method according to claim 12, further comprising a step of bonding a lead to the second metallization layer.

14. The method according to claim 12, wherein step (d) includes disposing the first metallization layer over an entire surface of the first oxide layer.

15. The method according to claim 14, wherein step (e) includes disposing the second metallization layer over an surface of the second oxide layer.

16. The method according to claim 15, wherein step (e) includes disposing a second metallization layer that is continuous with the first metallization layer.

17. The method according to claim 12, wherein step (e) includes disposing a second metallization layer that is continuous with the first metallization layer.

18. A method for manufacturing an integrated structure pad assembly, comprising the steps of:

growing an epitaxial layer of a first conductivity type over a semiconductor substrate;

growing a thick oxide layer over an entire top surface of said epitaxial layer;

selectively removing said thick oxide layer from regions above active areas of said epitaxial layer in which functionally active elementary cells are to be disposed to leave portions of said thick oxide layer;

implanting dopant ions of a second conductivity type into said active areas to form heavily doped regions of a second conductivity type;

growing a thin oxide layer over said active areas;

depositing a polysilicon layer over an entire top surface of said thin oxide layer and said portions of said thick oxide layer;

selectively removing said thin oxide layer and said polysilicon layer from above said active areas;

implanting dopant ions of said first conductivity type within said heavily doped regions of said second conductivity type to form heavily doped regions of said first conductivity type within said functionally active elementary cells;

depositing over an entire top surface of said functionally active elementary cells and the polysilicon layer a second insulating layer;

opening contact areas into said second insulating layer above said functionally active elementary cells; and depositing over said second insulating layer and said functionally active elementary cells a metallization layer such that said metallization layer entirely covers said second insulating layer and said functionally active elementary cells.

19. The method of claim 18, wherein the step of selectively removing said thick oxide layers from regions above said active areas to leave portions of said thick oxide layer includes selectively removing thick oxide layers from regions above said active areas to leave portions of said thick oxide layer that are disposed in a bi-dimensional array.

20. The method according to claim 18, wherein the step of selectively removing said thick oxide layers from regions above said active areas to leave portions of said thick oxide layer includes selectively removing thick oxide layers from regions above active areas that are disposed in a square array to leave portions of said thick oxide layer that surround said active areas that are disposed in said square array.

21. The method according to claim 18, wherein the step of selectively removing said thick oxide layers from regions above said active areas to leave portions of said thick oxide layer includes selectively removing thick oxide layers from regions above active areas that are disposed in a two-by-two square array to leave portions of said thick oxide layer that surround said active areas that are disposed in said two-by-two square array.

22. The method according to claim 18, wherein the step of selectively removing said thick oxide layers from regions above said active areas to leave portions of said thick oxide layer includes selectively removing thick oxide layers from regions above active areas to leave portions of said thick oxide layer that are in a one-dimensional array adjacent to said active areas.

23. The method according to claim 18, wherein the step of selectively removing said thick oxide layers from regions above said active areas to leave portions of said thick oxide layer includes selectively removing thick oxide layers from regions above active areas to leave portions of said thick oxide layer that are adjacent to said active areas.

* * * * *